United States Patent [19]

Pickett

[11] Patent Number: 4,755,696
[45] Date of Patent: Jul. 5, 1988

[54] CMOS BINARY THRESHOLD COMPARATOR

[75] Inventor: James K. Pickett, Kokomo, Ind.

[73] Assignee: Delco Electronics Corporation, Kokomo, Ind.

[21] Appl. No.: 66,319

[22] Filed: Jun. 25, 1987

[51] Int. Cl.[4] .............................................. H03K 5/24
[52] U.S. Cl. ..................................... 307/451; 307/448; 307/452; 307/464; 307/497; 340/146.2
[58] Field of Search ............... 307/443, 448, 449, 451, 307/452, 453, 464, 494, 496, 497; 340/146.2; 364/728, 769

[56] References Cited

U.S. PATENT DOCUMENTS

| | | | |
|---|---|---|---|
| 3,137,789 | 6/1964 | Chiapuzio, Jr. .................... 235/177 |
| 3,305,831 | 2/1967 | Nelson ............................ 340/146.2 |
| 3,492,644 | 1/1970 | Jensen ............................ 340/146.2 |
| 3,500,321 | 3/1970 | Cottrez ........................... 340/146.2 |
| 3,517,175 | 6/1970 | Williams ............................ 235/177 |
| 4,031,511 | 6/1977 | Britton ........................... 340/146.2 |
| 4,091,293 | 5/1978 | Ando .............................. 307/451 X |
| 4,109,141 | 8/1978 | Sasaki ......................... 340/146.2 X |
| 4,323,982 | 4/1982 | Eichrodt et al. ............. 340/146.2 X |
| 4,342,927 | 8/1982 | Hull .................................. 307/452 |
| 4,450,432 | 5/1984 | Schmidtpott et al. ........... 340/146.2 |
| 4,524,345 | 6/1985 | Sybel et al. .................... 340/146.2 |
| 4,618,784 | 10/1986 | Chappell et al. ................... 307/449 |
| 4,694,274 | 9/1987 | Shimada et al. ................ 340/146.2 |
| 4,710,649 | 12/1987 | Lewis .............................. 307/448 X |

FOREIGN PATENT DOCUMENTS

| | | | |
|---|---|---|---|
| 0233898 | 3/1986 | German Democratic Rep. ..................................... 307/496 |
| 0088919 | 5/1983 | Japan ................................. 307/497 |

Primary Examiner—Stanley D. Miller
Assistant Examiner—D. R. Hudspeth
Attorney, Agent, or Firm—Robert M. Sigler

[57] ABSTRACT

A binary threshold comparator is disclosed for first and second binary numbers, wherein the first is variable and the second is a threshold or reference, with the complement of the second number available. The comparator may be a high threshold (greater/equal) comparator or a low threshold (less/equal) comparator. It comprises 5 MOSFETs per bit stage, with two additional MOSFETs per comparator for high/low determination and carry in precharge. A particular multi-bit embodiment of the comparator has a modified most significant bit stage which provides a complement of the normal output when the most significant bits of the numbers to be compared are different to prevent an immediate reversal of comparator output when a counter containing the variable number rolls over from all ones to all zeros or vice versa.

10 Claims, 3 Drawing Sheets

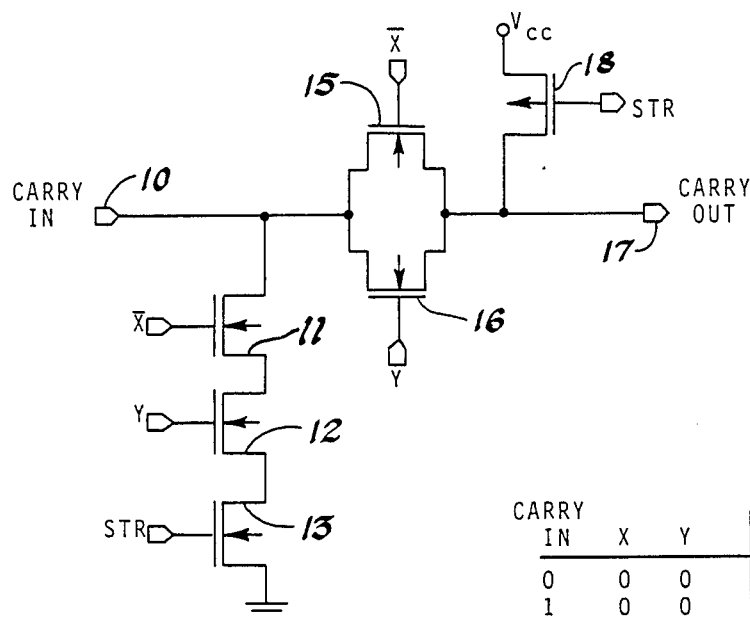
Fig. 1
Fig. 2
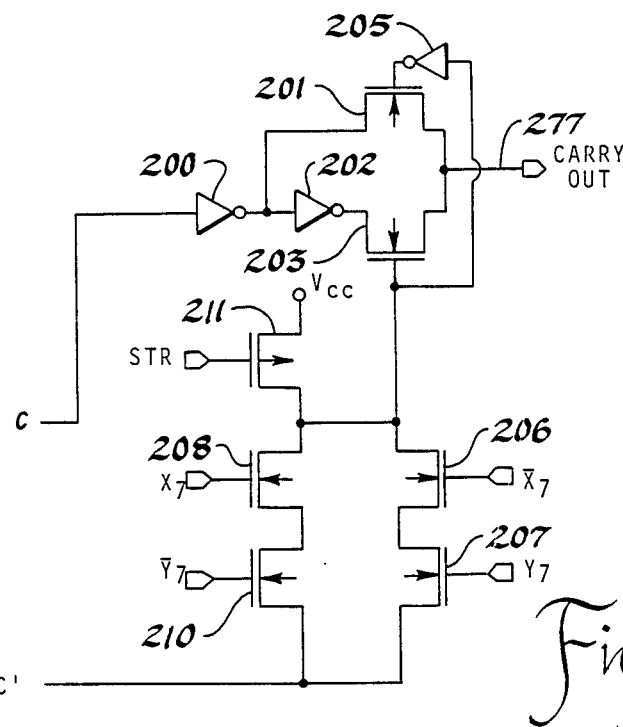
Fig. 4

CMOS BINARY THRESHOLD COMPARATOR

BACKGROUND OF THE INVENTION

This invention refers to a binary threshold comparator for use where the complement of the threshold number is available. A threshold comparator compares a first, varying, binary number with a second, threshold or reference, binary number and may be either of two types. A high threshold comparator indicates whether the first number (generally increasing) is greater than or equal to (greater/equal) the threshold or reference number. A low threshold comparator indicates whether the first number (generally decreasing) is less than or equal to (less/equal) the threshold or reference number. The two types are generally interchangeable in a circuit with some slight circuit modification and are thus considered equivalent.

The prior art in such comparators is shown in the circuit of FIG. 6. This circuit is for a single bit comparison and is seen to require 12 MOSFETs. An additional MOSFET would be required for the carry in terminal to establish the high/low threshold identity of the comparator, so that an eight bit version would require $8 \times 12 + 1 = 97$ MOSFETs.

SUMMARY OF THE INVENTION

The binary threshold comparator of this invention uses a strobe signal to precharge the comparator and requires only 5 MOSFETs per bit, plus two more MOSFETs per comparator: for high/low determination and for carry in precharge. A typical eight bit comparator according to the invention requires only $8 \times 5 + 2 = 42$ MOSFETs plus strobe generator. In a multi-bit comparator or series of comparators, or where a suitable strobe signal is already available, the savings in MOSFETs, and therefore in cost, can be substantial.

A single bit embodiment or stage of a comparator according to this invention comprises carry in and carry out terminals with first, second and third N channel MOSFETs connected in series between the carry in terminal and a low supply voltage, the first N channel MOSFET having a gate provided with the first number and the second N channel MOSFET having a gate provided with the complement of the second number. The third N channel MOSFET is actually shared by all stages, if more than one bit is being compared.

The comparator further comprises first and second additional MOSFETs connected in parallel between the carry in and carry out terminals, the first and second additional MOSFETs having gates provided with the first number and complement of the second number, respectively, if N channel and with the second number and the complement of the first number, respectively, if P channel. The circuit will be faster in operation if the first and second additional MOSFETs are N channel.

The comparator further comprises a first P channel MOSFET connected between the carry out terminal and a high supply voltage and having a gate, with means effective to provide a strobe voltage to the gates of the first P channel and the third N channel MOSFETs, the strobe voltage having an initial high value effective to render the first P channel MOSFET conducting and the third N channel MOSFET non-conducting and switching, when the first number and complement of the second number are provided to their respective MOSFET gates, to a low value effective to reverse the conducting and non-conducting states of the first P channel and third N channel MOSFETs, and a third additional MOSFET connected between the carry in terminal and one of the supply voltages, the third additional MOSFET being controlled by the strobe voltage to precharge the carry in terminal to a state determining the high/low sense of the binary threshold comparator. The strobe voltage providing means is also shared by all comparator stages. The third additional MOSFET may be a second P channel MOSFET connected to the high supply voltage and having a gate provided with the strobe voltage for a high threshold (greater/equal) comparison or a sixth N channel MOSFET connected to the low supply voltage and having a gate provided with the strobe voltage for a low threshold (less/equal) comparison.

In addition, in one multi-bit embodiment of the invention, the most significant bit stage is changed to provide a complement of the normal output when the most significant bits of the numbers to be compared are different to prevent an immediate reversal of comparator output when a counter containing the variable number rolls over from all ones to all zeros or vice versa. Further details and advantages will be apparent from the accompanying drawings and following description of a preferred embodiment.

SUMMARY OF THE DRAWINGS

FIG. 1 is a circuit diagram of a single bit stage preferred embodiment of the invention.

FIG. 2 is a truth table for a greater/equal embodiment of the circuit of FIG. 1.

FIG. 4 is a circuit diagram of a modification to FIG. 3C to produce an alternate embodiment of the invention.

DESCRIPTION OF A PREFERRED EMBODIMENT

Referring to FIG. 1, a carry in terminal 10 is connected through series connected N channel MOSFETs 11, 12 and 13 to a low supply voltage, ground. Carry in terminal 10 is further connected through parallel N channel MOSFETs 15 and 16 to a carry out terminal 17, which is also connected through a P channel MOSFET 18 to a high supply voltage $V_{cc}$. A fixed reference bit Y is provided to the gates of MOSFETs 12 and 16; a complement XBAR of the bit X to be compared is provided to the gates of MOSFETs 11 and 15; and a strobe signal STR is provided to the gates of MOSFETs 13 and 18. Carry in terminal 10 is provided by means not yet shown with a precharge voltage which determines the high/low identity of the threshold, as will be described at a later point in this specification.

In operation, STR is sent low to precharge the carry out terminal 17 to a high or one state by turning on MOSFET 18. At the same time, STR turns off MOSFET 13; and the XBAR and Y voltages settle on the gates of the other MOSFETs. When STR goes high, MOSFET 13 turns on, and MOSFET 18 turns off to allow carry out terminal 17 to assume a level dependent on the levels of XBAR, Y, and the preset voltage on the carry in and carry out terminals. If X is greater than Y (i.e., X=1, Y=0), then XBAR and Y must both be zero; and MOSFETs 11, 12, 15 and 16 are all off. Thus, carry out terminal 17 retains its precharged high state. If X is less than Y, than both XBAR and Y must be high or one. In this case, MOSFETs 11, 12, 15 and 16 are all on; and the carry out terminal 17 is pulled low by MOSFETs 11, 12 and 13 in series to ground. If X equals Y, than the level of carry in terminal 10 will be passed to carry out terminal 17, since one of MOSFETs 11 and 12 will be off; and one of MOSFETs 15 and 16 will be on. The result is shown in the truth table of FIG. 2 for the case of a high threshold or greater/equal comparator.

Figures 5A, 5B:
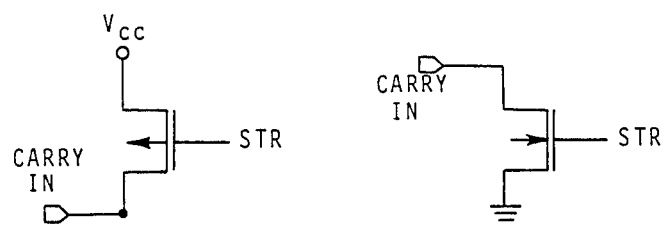
FIGS. 5A and 5B are circuit diagrams of alternate embodiments of circuits to be added to the circuit of FIG. 4 to determine whether the resulting comparator is a high or low threshold comparator.

To complete the circuit of FIG. 1, carry in terminal 10 is further connected as in FIG. 5A or 5B. FIG. 5A makes the threshold comparator of the invention a high threshold or greater/equal comparator. Carry in terminal 10 is connected through a P channel MOSFET 4 to high supply voltage $V_{cc}$, with its gate provided with signal STR. Thus, carry in terminal 10 is provided with a high precharge, which will be passed is provided with a high precharge, which will be passed through if X and Y are equal. A high output thus indicates greater/equal; while a low output indicates less. FIG. 5B shows the connection for a low threshold or less/equal comparator. An N channel MOSFET 9 is connected from carry in terminal 10 to ground with a gate provided with the strobe signal STR, In this case, carry in terminal 10 is precharged low, which will be passed through if the X and Y bits are equal. A low output thus indicates less/equal; while a high output indicates greater.

Figure 3A:
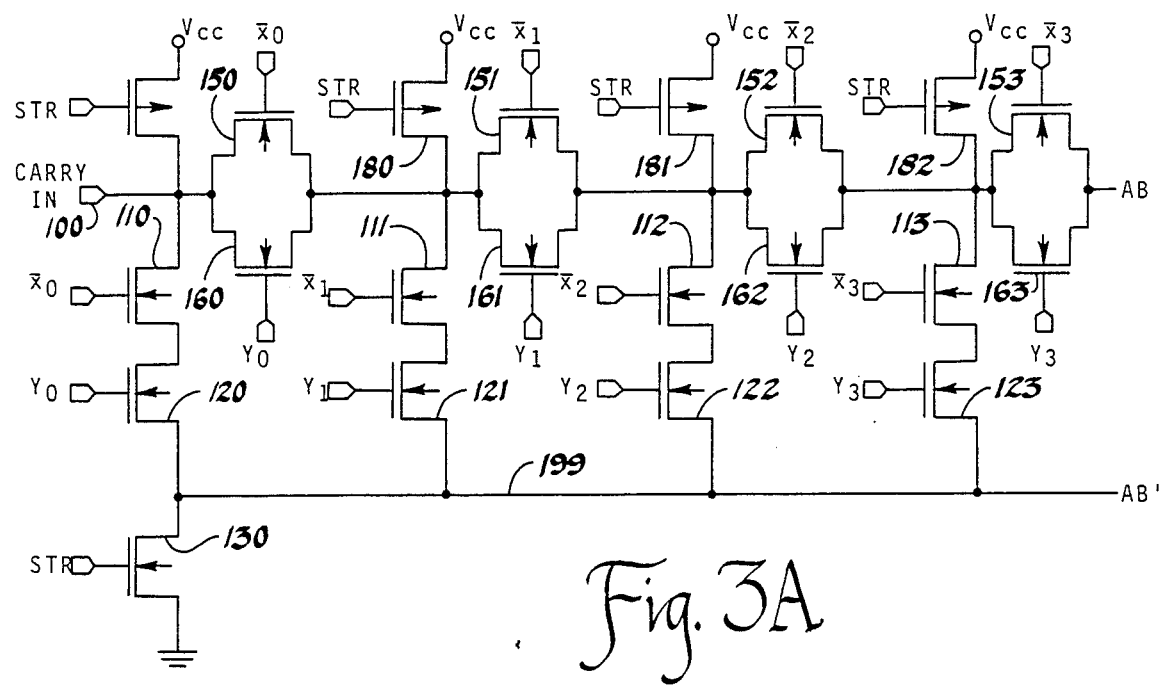
FIGS. 3A, 3B and 3C comprise a circuit diagram of a preferred multi-bit embodiment of the invention.
Figure 3B:
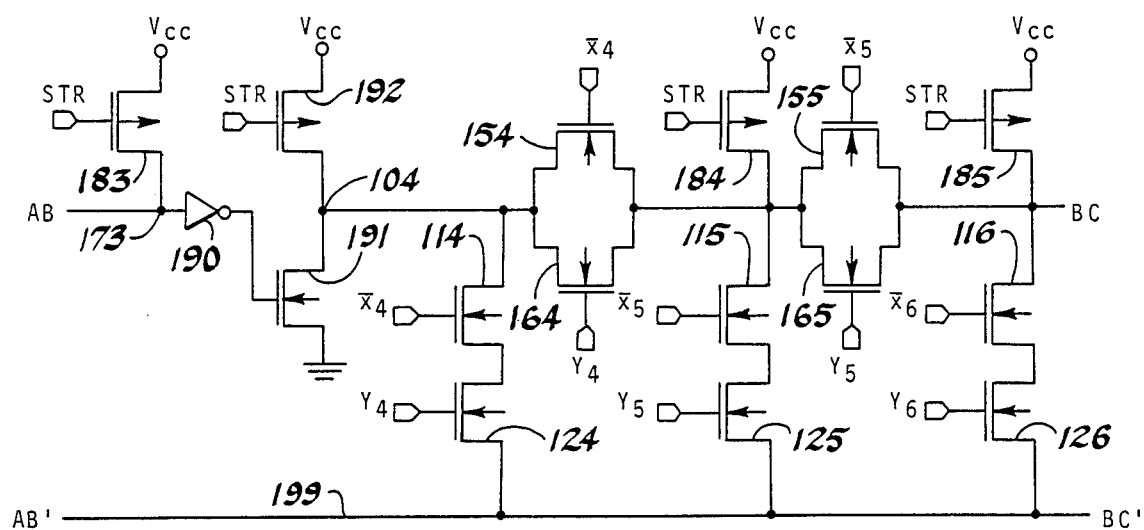
Figure 3C:
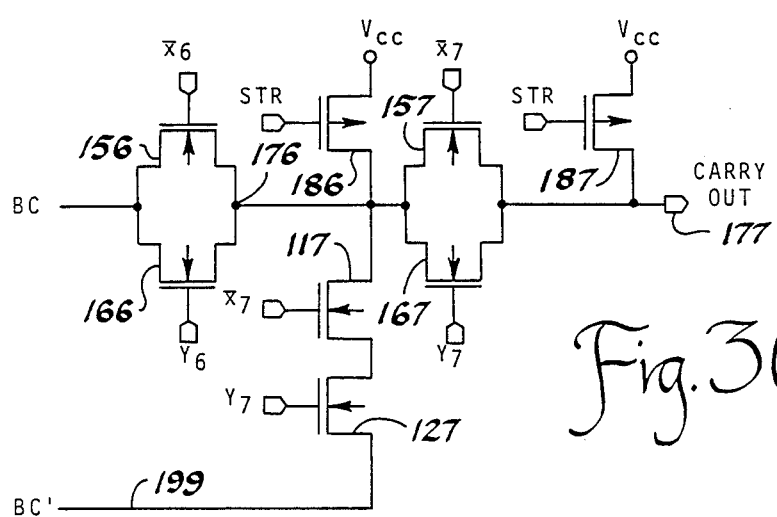

FIGS. 3A–3C show an eight bit greater/equal comparator comprising stages of one bit comparators such as that shown in FIG. 1 cascaded together. Circuit 3A is connected to circuit 3B at connections AB and AB'; similarly, circuits 3B and 3C are connected at connections BC and BC'. The MOSFETs of FIG. 3 are numbered to show their relation to the MOSFETs of the single bit stage of FIG. 1 and the bit number. For example MOSFETs 120, 121, 122, etc. of FIG. 3 correspond to MOSFET 12 for the 0, 1 and 2 bit stages of FIG. 3. The carry in terminal 100 of FIG. 3 is the carry in terminal of the least significant bit stage, with each succeeding carry in terminal connected to the carry out terminal of the preceding stage. The carry out terminal 177 of FIG. 3 is the carry out terminal of the most significant bit stage and the output of the comparator. A single strobe MOSFET 130 is sufficient for all stages, since the sources of MOSFETs 120-127 are connected together in a common conductor 199. Between the stages for bits 3 and 4 is inserted an optional unloading circuit for counteracting the loading effects of the MOSFETs 150, 151, etc. and MOSFETs 160, 161, etc. and thus speeding up circuit operation. The circuit comprises an inverter 190 connected between the carry out terminal 173 of stage 3 to the gate of an N channel MOSFET 191 having a grounded source and a drain connected to the source of a P channel MOSFET 192 and to the carry in terminal 104 of stage 4. MOSFET 192 further has a drain connected to $V_{cc}$ and a gate provided with the strobe signal STR. Carry in terminal 100 is connected to the chosen circuit of FIGS. 5A and 5B to create a high or low threshold comparator as previously described. If all bits of the multi-bit numbers are not equal, a one or zero will be generated by the most significant unequal bit stage and passed through to carry out terminal 177: high if X is greater and low if Y is greater.

FIG. 4 shows a modification to a portion of the circuit of FIG. 3C. The circuit of FIG. 4 replaces the most significant bit stage (7) of FIG. 3C; and connections C and C' are thus made to carry out terminal 176 and connection BC', respectively, of FIG. 3C. The modification of FIG. 4 is for the comparison of a counter to a fixed reference where the counter is one which has a maximum count with an overflow to zero. As such a counter is counted upward, a high threshold or greater/equal comparator would have a low output until the counter count equals the reference, whereupon its output would change to one. The output would remain one as the counter counts higher than the reference until it reached its maximum count, whereupon it would switch low again as the counter overflowed to zero and began its count again. This switch on overflow is often undesirable. The modification of FIG. 4 causes the comparator to indicate greater/equal as the counter counts from the count that is equal to the reference to the complement of that count. Therefore, once the counter count equals the reference, the comparator output will remain high even as the counter overflows until the count reaches the complement of the reference. As with the previously described comparators, operation is similar in the case of a low threshold or less/equal comparator.

Referring to FIG. 4, connection C is connected through an inverter 200 and an N channel MOSFET 201 to carry out terminal 277. The output of inverter 200 is also connected through another inverter 202 in series with another N channel MOSFET 203 to carry out terminal 277. The gate of MOSFET 203 is connected through an inverter 205 to the gate of MOSFET 201, so that one or the other of MOSFETs 201 and 203 are turned on by the signal at the gate of MOSFET 203.

The gate of MOSFET 203 is connected through a first series pair of N channel MOSFETs 206 and 207 to connection C', through a second pair of N channel MOSFETs 208 and 210 to connection C', and through a P channel MOSFET 211 to $V_{cc}$. Signals $X_7$ and $Y_7$ are provided to the gates of MOSFETs 208 and 207, respectively; while signals $XBAR_7$ and $YBAR_7$, the complements of $X_7$ and $Y_7$, are provided to the gates of MOSFETs 206 and 210, respectively. The gate of MOSFET 211 receives the strobe signal STR. In operation, the gates of MOSFETs 203 and 201 are precharged high and low, respectively, due to MOSFET 211, the STR signal, and inverter 205. The carry in of the remainder of the comparator stages appears at connection C. If $X_7$ and $Y_7$ are equal, one of MOSFETs 206 and 207 will be off, and one of MOSFETs 208 and 210 will be off. Thus, the precharge on the gates of MOSFETs 203 and 201 will remain. MOSFET 203 will be on; and the level of connection C will be passed through to carry out terminal 277. If $X_7$ and $Y_7$ are unequal, however, one or the other pair of MOSFETs 206, 207 or 208, 210 will be turned on to ground the gate of MOSFET 203. Thus, MOSFET 201 will be turned on; and the complement of the level at connection C will be passed through to carry out terminal 277. It is at counter overflow that the equality of $X_7$ and $Y_7$ suddenly changes logical value; and the switch to the complement of the comparison of the less significant bits is thus coordinated with this change to produce the desired result.

Figure 6:
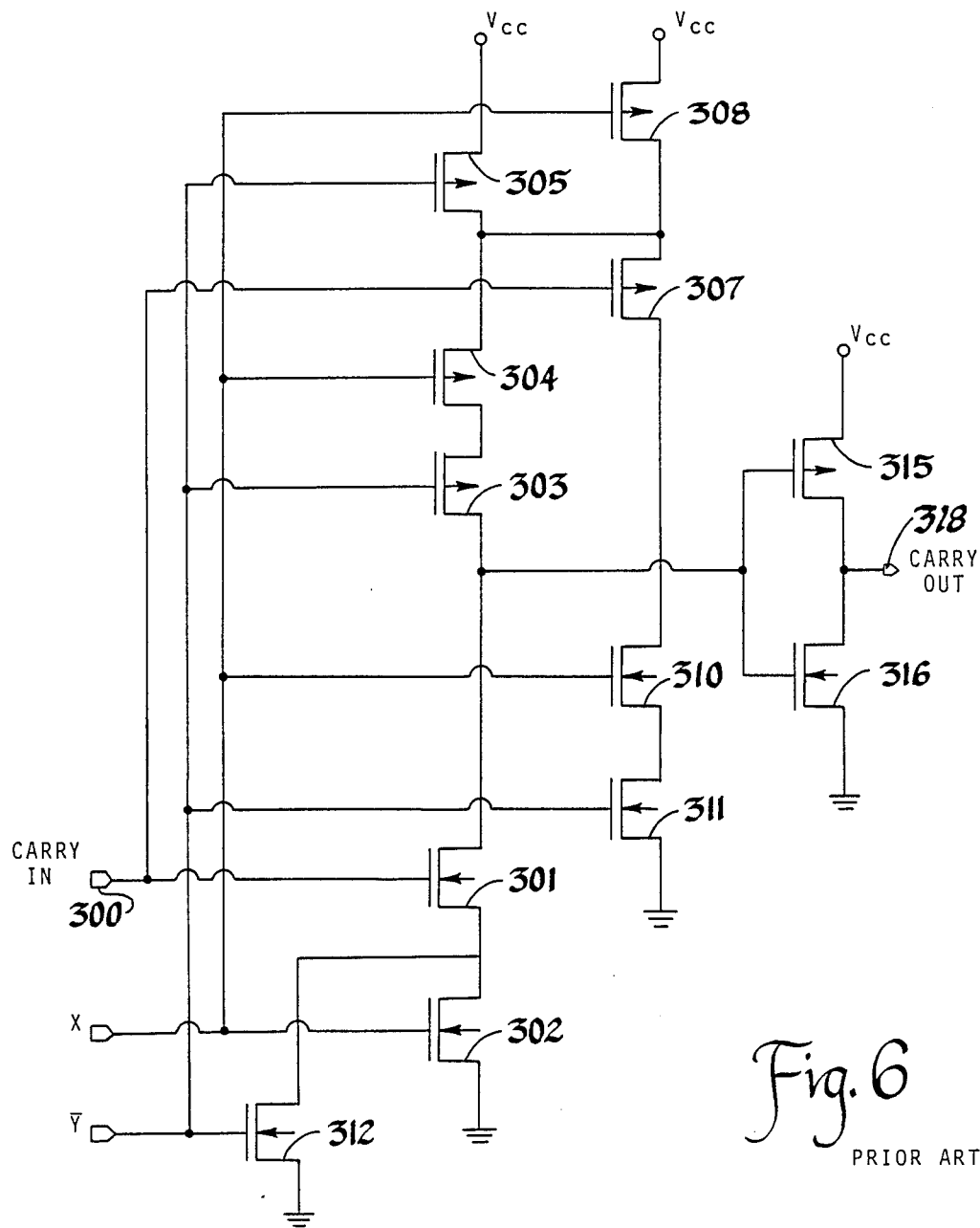
FIG. 6 is a single bit stage comparator according to the prior art.

FIG. 6 shows a single bit comparator according to the prior art. A carry in terminal 300 is connected to the gate of an N channel MOSFET 301 in series with another N channel MOSFET 302 to ground and P channel MOSFETs 303, 304 and 305 to positive voltage $V_{cc}$. Carry in terminal 300 is further connected to the gate of a P channel MOSFET 307 connected in series with another P channel MOSFET 308 to $V_{cc}$ and N channel MOSFETs 310 and 311 to ground. An N channel MOSFET 312 is connected between the junction of MOSFETs 301 and 302 and ground. The variable number X is provided to the gates of MOSFETs 302, 304, 308 and 310. YBAR, the complement of the reference number Y, is provided to the gates of MOSFETs 303, 305, 311 and 312. The junction of MOSFETs 304 and 305 is connected to the junction of MOSFETs 307 and 308. The junction of MOSFETs 301 and 303 is connected to the gates of P channel MOSFET 315 and N channel MOSFET 316 connected in series between $V_{cc}$ and ground. The junction of MOSFETs 315 and 316 comprises a carry out terminal 318, which is the output of the comparator.

In operation, when X is greater than Y, MOSFETs 305 and 308 are turned off; and MOSFETs 310 and 311 are turned on. This forces a high output at carry out terminal 318. If X is less than Y, MOSFETs 310 and 311 are off; and MOSFETs 303, 304 and 305 are all on, which produces a low output on carry out terminal 318. If X and Y are both low, then MOSFETs 302, 305 and 310 are off; but MOSFETs 308 and 312 are on. This causes the voltage on carry in terminal 300 to be passed through to carry out terminal 318. If X and Y are both high, then MOSFETs 308, 311 and 312 are all off; but MOSFETs 302 and 305 are on. Once again, the voltage on carry in terminal 300 is passed through to carry out terminal 318.

It should be apparent, in the description of the preferred embodiment and the claims, that any embodiment described and claimed herein may be entirely reversed in polarity. That is, an embodiment may have its N channel MOSFETs which are connected to ground changed to P channel MOSFETs connected to $V_{cc}$ and vice versa, while the STR signal and other signals are also reversed. The embodiment shown is preferred because it uses the MOSFETs in their fastest mode of operation; but a reversed polarity embodiment, obvious in structure in view of this description, is considered an equivalent structure covered by the claims.

The embodiments of the invention in which an exclusive property or privilege is claimed are defined as follows:

1. A binary threshold comparator for first and second binary numbers represented by predetermined high/low voltages, wherein the complement of the second number is available, the comparator comprising, in combination:
   carry in and carry out terminals;
   first, second and third N channel MOSFETs connected in series between the carry in terminal and a low supply voltage, the first N channel MOSFET having a gate provided with the first number and the second N channel MOSFET having a gate provided with the complement of the second number;
   first and second additional MOSFETs connected in parallel between the carry in and carry out terminals, the first and second additional MOSFETs having gates provided with the first number and complement of the second number, respectively, if N channel and with the second number and the complement of the first number, respectively, if P channel;
   a first P channel MOSFET connected between the carry out terminal and a high supply voltage and having a gate;
   means effective to provide a strobe voltage to the gates of the first P channel and the third N channel MOSFETs, the strobe voltage having an initial low value effective to render the first P channel MOSFET conducting and the third N channel MOSFET non-conducting and further being effective to switch, when the first number and complement of the second number are provided to their respective MOSFET gates, to a high value effective to reverse the conducting and non-conducting states of the first P channel and third N channel MOSFETs; and
   a third additional MOSFET connected between the carry in terminal and one of the supply voltages, the third additional MOSFET being controlled by the strobe voltage to precharge the carry in terminal to a state determining the high/low sense of the binary threshold comparator.

2. The binary threshold comparator of claim 1 in which the first and second additional MOSFETs are fourth and fifth N channel MOSFETs with gates provided with the first number and the complement of the second number, respectively.

3. The binary threshold comparator of claim 1 wherein the third additional MOSFET is a second P channel MOSFET connected to the high supply voltage and having a gate provided with the strobe voltage for a high threshold (greater/equal) comparison.

4. The binary threshold comparator of claim 1 wherein the third additional MOSFET is a sixth N channel MOSFET connected to the low supply voltage and having a gate provided with the strobe voltage for a low threshold (less/equal) comparison.

5. A binary threshold comparator for first and second binary numbers of one or more bits with each bit represented by predetermined high/low voltages, wherein the complement of the second number is available, the comparator comprising one or more cascaded stages in combination, one for each bit beginning with the least significant, each stage comprising:
   (1) carry in and carry out terminals, the carry in terminal, except for that of the least significant bit stage, being connected to the carry out terminal of the preceding, lesser bit stage, the carry out terminal of the most significant bit stage comprising an output for the comparator;
   (2) first and second N channel MOSFETs connected in series between the carry in terminal and a common conductor;
   (3) fourth and fifth N channel MOSFETs connected in parallel between the carry in and carry out terminals, the first and fourth N channel MOSFETs having gates provided with the appropriate bit of the first number and the second and fifth N channel MOSFETs having gates provided with the appropriate bit of the complement of the second number;
   (4) a first P channel MOSFET connected between the carry out terminal and a high supply voltage and having a gate; and
   (5) means effective to provide a strobe voltage to the gate of the first P channel MOSFET, the strobe voltage having an initial low value effective to render the first P channel MOSFET conducting and further being effective to switch, when the first number and complement of the second number are provided to their respective MOSFET gates, to a high value effective to reverse the conducting and non-conducting states of the first P channel MOSFET;

the comparator further comprising:
a third N channel MOSFET connecting the common conductor to a low supply voltage and having a gate connected to receive the strobe signal;
an additional MOSFET connected between the carry in terminal of the least significant bit stage and one of the supply voltages, the additional MOSFET being controlled by the strobe voltage to precharge the carry in terminal to a state determining the high/low sense of the binary threshold comparator.

6. The binary threshold comparator of claim 5 wherein the additional MOSFET is a second P channel MOSFET connected to the high supply voltage and having a gate provided with the strobe voltage for a high threshold (greater/equal) comparison.

7. The binary threshold comparator of claim 5 wherein the additional MOSFET is a sixth N channel MOSFET connected to the low supply voltage and having a gate provided with the strobe voltage for a low threshold (less/equal) comparison.

8. A binary threshold comparator for first and second multi-bit binary numbers with each bit represented by predetermined high/low voltages, wherein the complement of the second number is available, the comparator comprising one or more cascaded stages in combination, one for each bit beginning with the least significant, each stage except that for the most significant bit comprising:
   (1) carry in and carry out terminals, the carry in terminal, except for that of the least significant bit stage, being connected to the carry out terminal of the preceding, lesser bit stage;
   (2) first and second N channel MOSFETs connected in series between the carry in terminal and a common conductor;
   (3) fourth and fifth N channel MOSFETs connected in parallel between the carry in and carry out terminals, the first and fourth N channel MOSFETs having gates provided with the appropriate bit of the first number and the second and fifth N channel MOSFETs having gates provided with the appropriate bit of the complement of the second number;
   (4) a first P channel MOSFET connected between the carry out terminal and a high supply voltage and having a gate; and
   (5) means effective to provide a strobe voltage to the gate of the first P channel MOSFET, the strobe voltage having an initial low value effective to render the first P channel MOSFET conducting and further being effective to switch, when the first number and complement of the second number are provided to their respective MOSFET gates, to a high value effective to reverse the conducting and non-conducting states of the first P channel MOSFET;

the most significant bit stage comprising:
   (1) a carry in terminal connected to the carry out terminal of the next most significant bit stage and a carry out terminal comprising an output for the comparator;
   (2) first and second N channel MOSFETs connected in series between a control terminal and the common conductor and having gates provided with the most significant bits of the first number and the complement of the second number, respectively;
   (3) fourth and fifth N channel MOSFETs connected in parallel between the carry in and carry out terminals with first inverting means connected in series with the fourth N channel MOSFET, the gate of the fifth N channel MOSFET being connected to the control terminal and, through second inverting means, to the gate of the fourth N channel MOSFET;
   (5) a first P channel MOSFET connected between the control terminal and the high supply voltage, the gate thereof being provided with the strobe signal; and
   (6) seventh and eighth N channel MOSFETs connected in series between the control terminal and the common conductor, the gates of the seventh and eighth N channel MOSFETs being provided with the most significant bits of the second number and the complement of the first number, respectively;

the comparator further comprising:
a third N channel MOSFET connecting the common conductor to a low supply voltage and having a gate connected to receive the strobe signal so as to assume the opposite conducting state from the strobe signal as a P channel MOSFET so supplied; and
an additional MOSFET connected between the carry in terminal of the least significant bit stage and one of the supply voltages, the additional MOSFET being controlled by the strobe voltage to precharge the carry in terminal to a state determining the high/low sense of the binary threshold comparator.

9. The binary threshold comparator of claim 8 wherein the additional MOSFET is a second P channel MOSFET connected to the high supply voltage and having a gate provided with the strobe voltage for a high threshold (greater/equal) comparison.

10. The binary threshold comparator of claim 8 wherein the additional MOSFET is a sixth N channel MOSFET connected to the low supply voltage and having a gate provided with the strobe voltage for a low threshold (less/equal) comparison.

* * * * *